United States Patent [19]

Balogh, Jr. et al.

[11] Patent Number: 4,811,275

[45] Date of Patent: Mar. 7, 1989

[54] ADDRESSING SYSTEM FOR AN EXPANDABLE MODULAR ELECTROMECHANICAL MEMORY ASSEMBLY

[75] Inventors: Edward Balogh, Jr., La Jolla; David D. Faultersack, Escondido; Jack Peter, San Diego; Stephen P. Roddy, San Diego; Eric B. Thune, San Diego, all of Calif.

[73] Assignee: Unisys Corporation, Blue Bell, Pa.

[21] Appl. No.: 867,459

[22] Filed: May 28, 1986

[51] Int. Cl.$^4$ .................................................. G06F 3/00
[52] U.S. Cl. ...................................... 364/900; 361/393
[58] Field of Search ... 364/200 MS File, 900 MS File; 361/395, 399, 412, 413, 415, 393, 400; 439/631, 65

[56] References Cited

U.S. PATENT DOCUMENTS

| | | | |
|---|---|---|---|
| 4,250,563 | 2/1981 | Struger | 361/393 X |
| 4,443,866 | 4/1984 | Burgiss | 364/900 |
| 4,562,535 | 12/1985 | Vincent et al. | 364/200 |
| 4,626,846 | 12/1986 | Parker et al. | 340/825 |
| 4,639,863 | 1/1987 | Harrison et al. | 364/708 X |
| 4,680,674 | 7/1987 | Moore | 361/395 |

Primary Examiner—Raulfe B. Zache
Assistant Examiner—Florin Munteanu-Ramnic
Attorney, Agent, or Firm—Charles J. Fassbender; Kenneth L. Miller

[57] ABSTRACT

An easily installable and easily expandable electromechanical memory assembly for a data processing system includes: a frame having a backplane, a plurality of printed circuit board connectors on the backplane, and conductors on the backplane which interconnect the connectors; a controller on a printed circuit board which is plugged into one of the connectors and consists essentially of logic circuitry for generating and receiving control signals on the backplane conductors; and multiple data storage units; each unit being mounted on a separate printed circuit board, plugged into a separate connector, and consisting essentially of a mechanical drive mechanism which reads data by physically moving a data storage medium past a data sensor in direct response to the control signals from the controller on the backplane conductors. Each data storage unit has switches for assigning an address to the drive and has terminals for receiving signals from the backplane conductors which select the drive based on the state of the switches and received signals. These switches are set to assign the same address to each drive. Signals on the backplane conductors which are transmitted from the controller in a daisy-chained fashion to all of the drives are also returned via the backplane conductors to the controller, and are there terminated.

7 Claims, 4 Drawing Sheets

ADDRESSING SYSTEM FOR AN EXPANDABLE MODULAR ELECTROMECHANICAL MEMORY ASSEMBLY

BACKGROUND OF THE INVENTION

This invention relates to electromechanical memory assemblies for data processing systems; and in particular, it relates to the packaging of such assemblies.

By an electromechanical memory assembly is herein meant an assembly of multiple data storage units each of which reads and writes data by physically moving a data storage medium past a data sensor. Two common examples of such data storage units are disk drives and tape drives.

In the prior art, various standard interfaces have been defined for disk drives and tape drives which specify how they are to be intercoupled in an assembly. One such standard called ESDI specifies the interface coupling for disk drives; whereas another standard called QIC-02 specifies the interface coupling for tape drives.

Basically, with the ESDI disk interface, control signals are daisy-chained from a disk controller to all the drives, and data signals are sent radially between the controller and each drive. With the QIC-02 tape interface, both control and data signals are daisy-chained between a tape controller and all of the tape drives.

Also, with both of the ESDI and QIC-02 interfaces, switches or jumpers are provided on each drive which must be set to assign that drive a unique address. This unique address enables the drives to be individually selected and operated one at a time via the interface signals. Further, with both interfaces, sockets for receiving resistors which terminate the daisy-chained signals from the controller are provided in each drive, and the terminating resistors must be inserted in the socket of only the last drive of the daisy chain.

Accordingly, to initially install the drives of a multi-drive memory assembly, all the daisy-chained cables must be correctly connected; all the radial cables must be correctly connected; all the address switches in the drives must be differently set; and the terminating resistors must be inserted in the last drive only. These steps, however, are time-consuming and are susceptible to human error. Further, in many electromechanical memory assemblies where a premium is placed on space, the cables and drives are squeezed into a small frame and are difficult to even reach.

Similar problems are also encountered when a new drive is added to an existing memory assembly. To add the new drive, another daisy-chain cable has to be connected between the existing last drive and the new drive; the terminating resistors have to be moved from the existing last drive to the new drive; a radial cable (in the case of a disk) has to be connected between the controller and the new last drive; and the address switches have to be set to a unique address in the new drive.

Recently, memory "filecards" have been introduced into the market which do simplify the installation procedure for a single drive. A filecard is a printed circuit board which contains a controller and to which a drive mechanism is attached in a piggyback fashion to the back of the board. See, for example, *Mini-Micro Systems*, April 1968, pages 28 and 32. To install such a filecard, the card is simply plugged into a connector in a backplane. Cabling between the controller and the drive runs off the back of the board to the piggybacked drive and is installed at the factory.

However, these filecards are not suitable for multi-drive memory assemblies. To add another drive, another new filecard which includes both the drive mechanism and the controller must be added. This is not economical since the controller portion of the card costs about the same as the drive portion of the card. If one were to somehow mount just a bare drive in the assembly, cabling would still have to be installed between the piggybacked drive on the drivecard and the new drive which complies with ESDI, QIC-02, or a similar standard. Terminating resistors would also have to be moved to the new drive; and a unique address would have to be set. But such installation steps would again be time-consuming and accompanied by human error.

Accordingly, a primary object of the invention is to provide an electromechanical memory assembly which overcomes the above described deficiencies.

BRIEF SUMMARY OF THE INVENTION

In accordance with the invention, an easily installable and easily expandable electromechanical memory assembly for a data processing system includes:

a frame having a backplane, a plurality of printed circuit board connectors on said backplane, and conductors which interconnect the connectors on the backplane;

a controller, on a printed circuit board which is plugged into one of said connectors and consists essentially of logic circuitry for generating and receiving control signals on the backplane conductors; and multiple data storage units; each unit being mounted on a separate printed circuit board, plugged into a separate one of the connectors, and consisting essentially of a mechanical drive mechanism which reads data by physically moving a data storage medium past a data sensor in direct response to the control signals from the controller on the backplane conductors.

Each data storage unit has switches for assigning an address to the drive and has address terminals for receiving address signals which select the drive when they equal the assigned address. These switches are set to assign the same address to each drive; and a separate address signal is sent on a separate backplane conductor from the controller board to the same address terminal on each drive.

Control signals which are transmitted from the controller in a daisy-chained fashion via the backplane conductors to all of the drives are also returned via the backplane conductors to the controller, where they are terminated in respective resistors.

BRIEF DESCRIPTION OF THE DRAWINGS

Various features and advantages of the invention are described herein in conjunction with the accompanying drawings wherein.

DETAILED DESCRIPTION OF THE INVENTION

Figure 1:
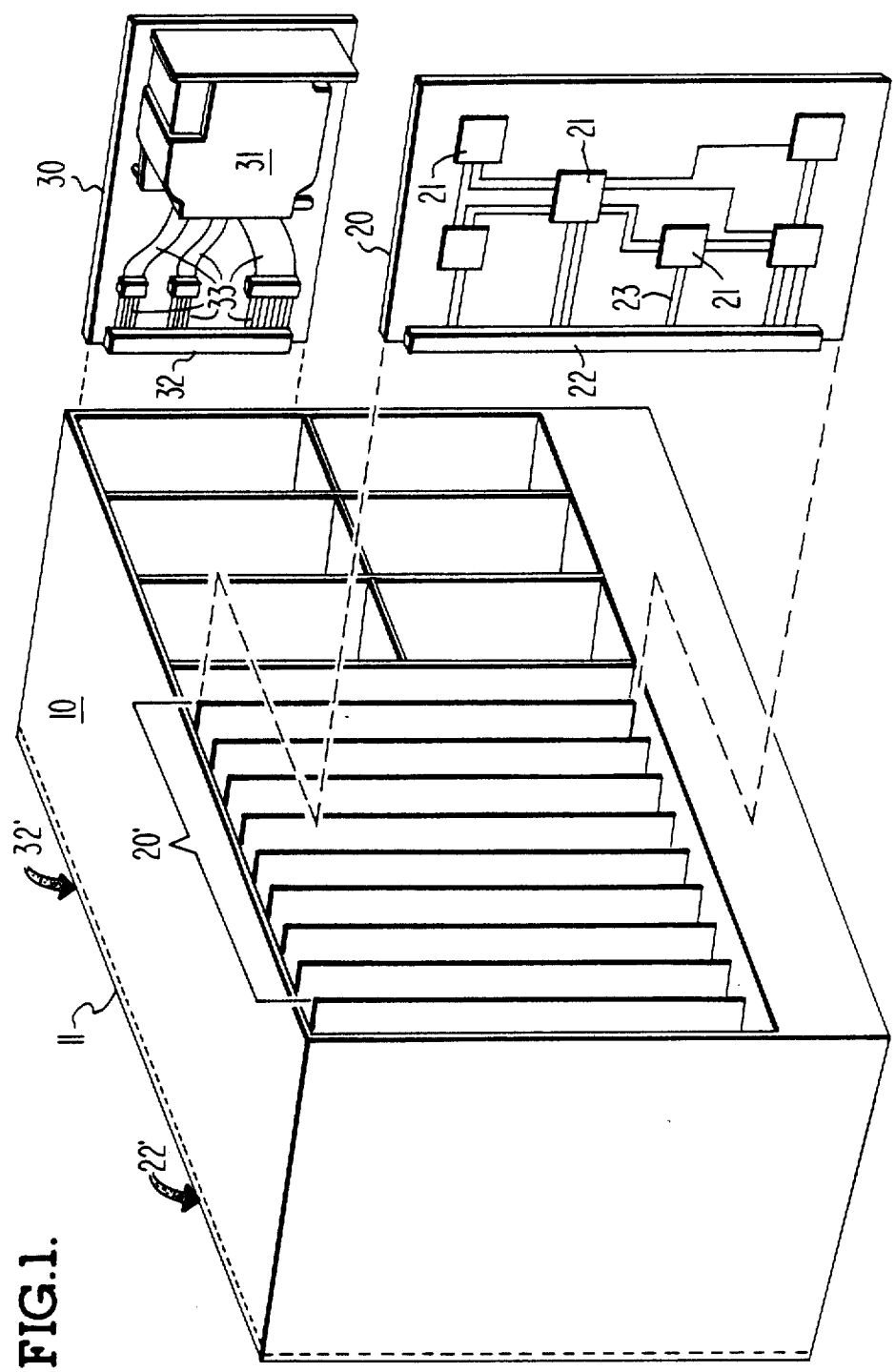
FIG. 1 is a pictorial view of an electromechanical memory assembly that is constructed according to the invention.

Referring now to the figures, a preferred embodiment of an electromechanical memory assembly that is constructed according to the invention will be described in detail. This embodiment is illustrated in a pictorial view in FIG. 1. It includes a frame 10, a backplane 11 which is bolted to the back of the frame, and two types of printed circuit boards 20 and 30 which plug into the backplane.

Each of the boards 20 holds essentially only logic chips 21, whereas each of the boards 30 holds essentially only a drive mechanism 31 for a data storage media such as a disk or tape. The only other items on the boards 20 are connectors 22 which mate with corresponding connectors 22' on backplane 11, and conductors 23 which carry signals between the connectors 22 and the chips 21. Similarly, the only other items on the boards 30 are connectors 32 which mate with corresponding connectors 32' on backplane 11, and conductors 33 which carry signals between the connectors 32 and the drive mechanism 31.

Figure 2:
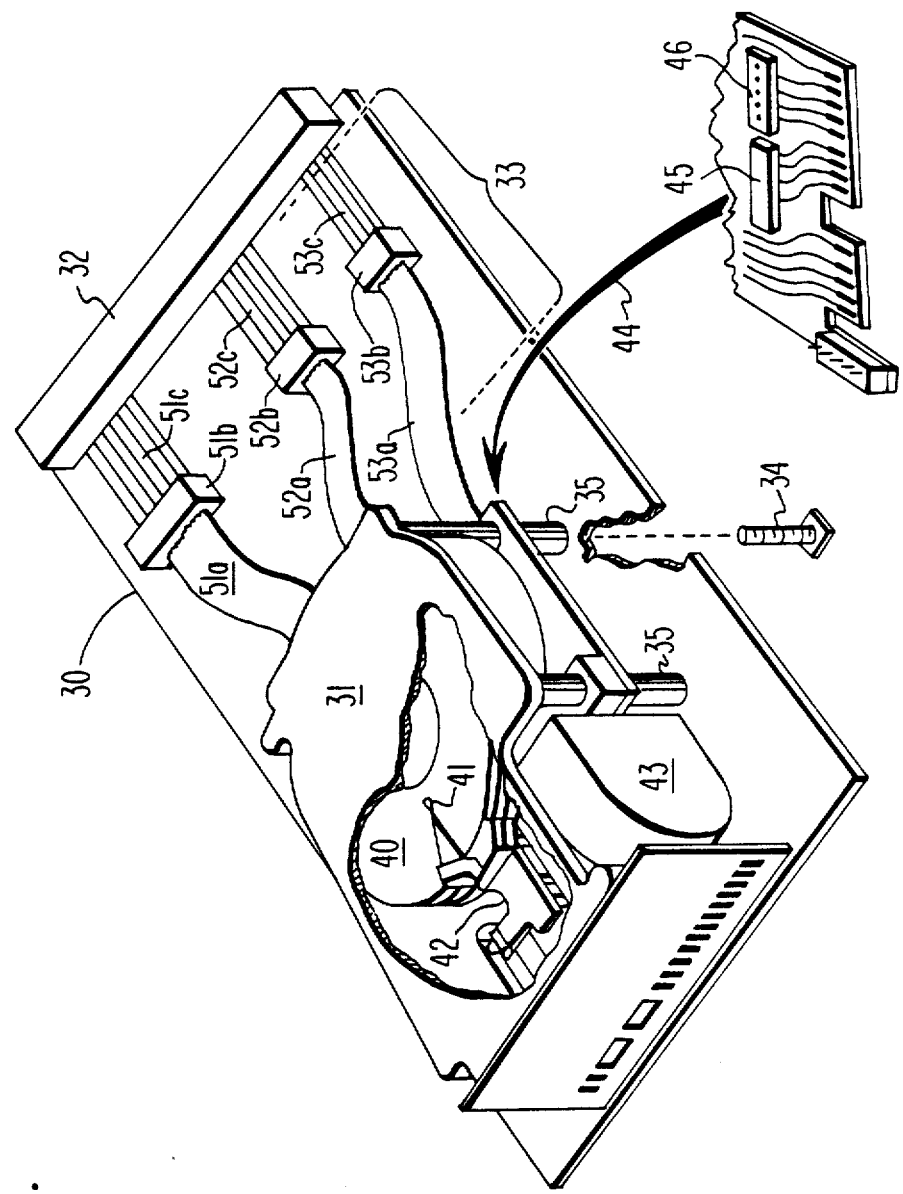
FIG. 2 shows the details of one of the boards in the FIG. 1 assembly which contains a disk drive.

A detailed view of one of the boards 30 is illustrated in FIG. 2. This particular board holds a EXT-4075 TM disk drive which is sold by Maxtor Corporation, 61 East Daggett Dr., San Jose, Calif. 95134. It provides an unformatted storage capacity of 76.4 megabytes; it is 3.25 inches high, 5.75 inches wide, 8.0 inches long; it weighs 6.3 pounds; and it is mounted on board 30 by four screws 34 which fit through the board 30 and spacers 35.

Major components of the FIG. 2 drive are a data storage media 40, a read/write head 41, a carriage 42 for the head, and a motor 43 for moving the storage media 40 and carriage 42. Drive electronics 44 are also provided which transmit/receive signals between the drive 31 and connector 32. That drive circuitry operates in conformance with disk interface standard ESDI.

Signals which standard ESDI specifies as being daisy-chained to all of the disk drives pass through a flat cable 51a, a connector 51b, and etched metal lines 51c. Signals which standard ESDI specify as being radially connected to each disk drive pass through a flat cable 52a, a connector 52b, and etched metal lines 52c. DC power is supplied to the disk drive via a cable 53a, a connector 53b, and etched metal lines 53c. Cables 51a, 52a, and 53a attach via connectors (hid by the drive) to the drive electronics 44.

Another one of the boards 30, which holds a tape drive, is the same as the FIG. 2 board except the disk 31 is replaced with a tape drive and the radial connection components 52a, 52b and 52c are removed. One suitable tape drive is a model 5320C Scorpion TM ¼ inch streaming cartridge tape drive from Archive Corporation, 3540 Cadillac Street, Costa Mesa, Calif. 92626. It has a storage capacity of 20 megabytes; it is 1.6 inches high, 5.7 inches wide, 8.0 inches long; it weighs 3.0 pounds; and it is mounted on the board 30 by screws 34 and spacers 35 just like the disk drive in FIG. 2.

Drive electronics are provided on this tape which operate in conformance with tape interface standard QIC-02. Signals which standard QIC-02 specify as being daisy-chained to all the drives pass through flat cable 51a, connector 51b, and etched metal lines 51c. DC power is supplied to the tape via cable 53a, connector 53b, and etched metal lines 53c.

Figure 3:
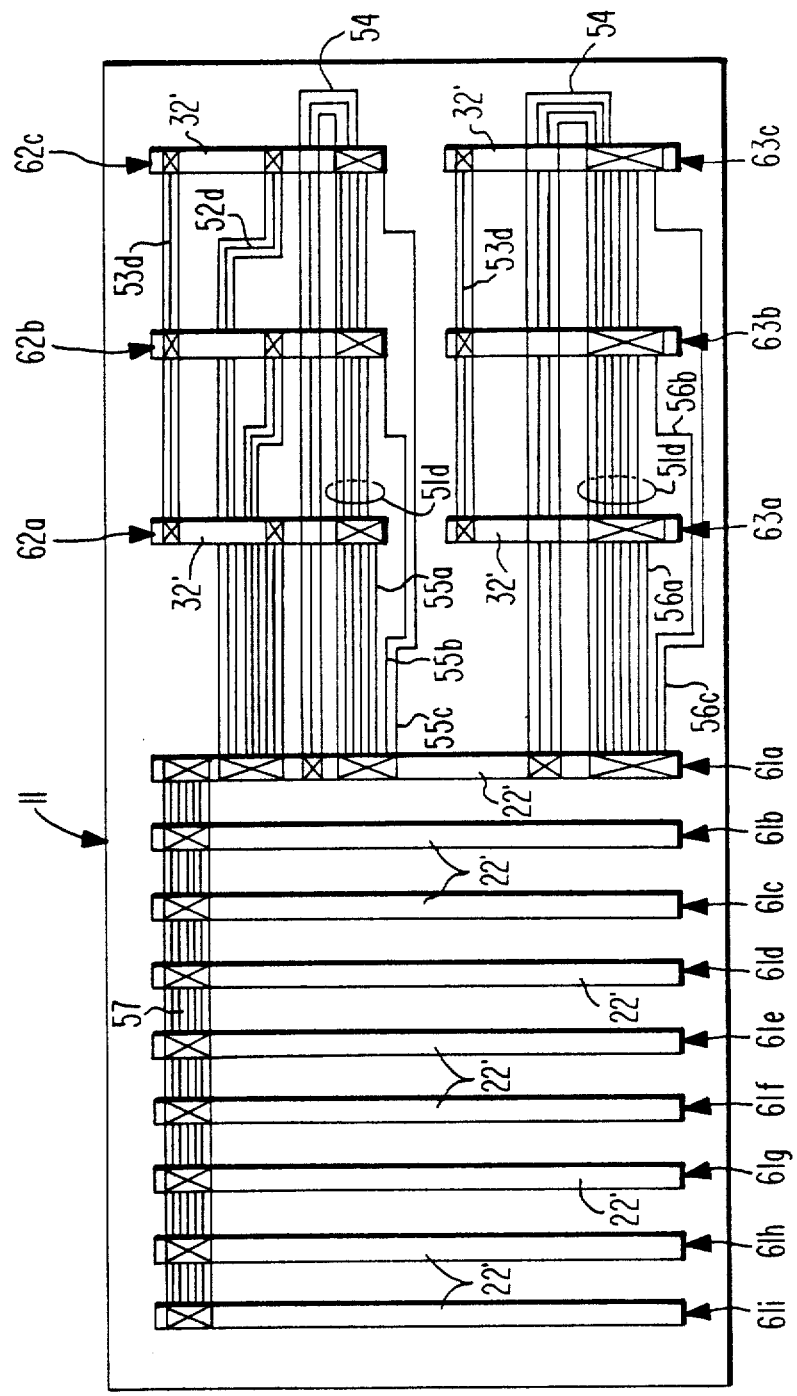
FIG. 3 shows the mating connectors on the backplane in the FIG. 1 assembly and the conductors between these connectors.

FIG. 3 shows the mating connectors 22' and 32' as they are positioned along backplane 11. Those boards 20 which hold the logic chips 21 are inserted into the mating connectors 22' at any of the locations that are indicated by reference numerals 61a–61i; those boards 30 which hold a disk drive are inserted into the mating connectors 32' at any of the locations 62a–62c; and those boards 30 that hold a tape drive are inserted into mating connectors 32' at any of the locations 63a–63c.

FIG. 3 also shows the conductors on backplane 11 which carry various signals between the connectors 22' and 32'. Connector 22' at location 61a holds a single control board 20a (see FIG. 4) which controls all the tape and disk drives. Daisy-chained conductors between this board 20a and the drives are indicated by reference numeral 51d; radial conductors between board 20a and the drives (disk only) are indicated by reference numeral 52d; and power conductors between the drives are indicated by reference numeral 53d.

Daisy-chained conductors 51d which carry signals that are transmitted by control board 20a are looped back to that board. This loop is indicated by reference numeral 54. Signals which are looped back are then terminated in a resistor network R (see FIG. 4) on control board 20a to reduce reflections. Sockets for terminating resistors are also provided with the disk and tape drives as indicated by reference numeral 45 in FIG. 2; but here, all of those sockets are left empty.

Disk interface standard ESDI says that each disk is selected by three daisy-chained drive select (DS) signals DS3, DS2, and DS1. Disks numbered 1,2,3,4,5,6,7 are separately selected when signals DS3, DS2, DS1 equal 001, 010, 011, 100, 101, 110, and 111 respectively. No disk is selected when signal DS3, DS2, DS1 equal 000. In FIG. 3, however, new signals DS3', DS2', and DS1' which are not daisy-chained are sent in place of the DS3, DS2, and DS1 signals.

Signals DS3', DS2', DS1' are sent on conductors 55c, 55b, 55a respectively. Signal DS3' on conductor 55c goes to the connector terminal in location 62a which ESDI says should receive DS1; signal DS2' on conductor 55b goes to the connector terminal in location 62b which ESDI says should receive DS1; and signal DS1' on conductor 55a goes to the connector terminal in location 62a which ESDI says should receive DS1. Connector terminals which ESDI says should receive DS2 and DS3 are grounded.

Also, according to tape interface standard QIC-02, an eight-bit wide daisy-chained bus together with a single daisy-chained REQUEST signal are used to select each tape drive. Various commands are sent on this bus in conjunction with the REQUEST signal; and a hexidecimal 01, 02, 04, 08 on the bus together with the REQUEST signal will respectively select drive 1, drive 2, drive 3, and drive 4. Here, new REQUEST1', REQUEST2', and REQUEST3' signals which are not daisy-chained are sent in place of the REQUEST signal.

REQUEST1' is sent on conductor 56a to the connector terminal in location 63a which QIC-02 says should receive the daisy-chained REQUEST signal; REQUEST2' is sent on conductor 56b to the connector terminal in location 63b which QIC-02 says should receive the daisy-chained REQUEST signal; and REQUEST3' is sent on a conductor 56c to the connector terminal in location 63c which QIC-02 says should receive the daisy-chained REQUEST signal.

Each disk and tape drive includes an address switch or address plug as indicated by reference numeral 46 in FIG. 2 which operates to assign an address to the drive. ESDI and QIC-02 both say that these switches must be set to assign different addresses to each drive. Here, however, the switch or plug is set to assign address #1 to each drive.

Figure 4:
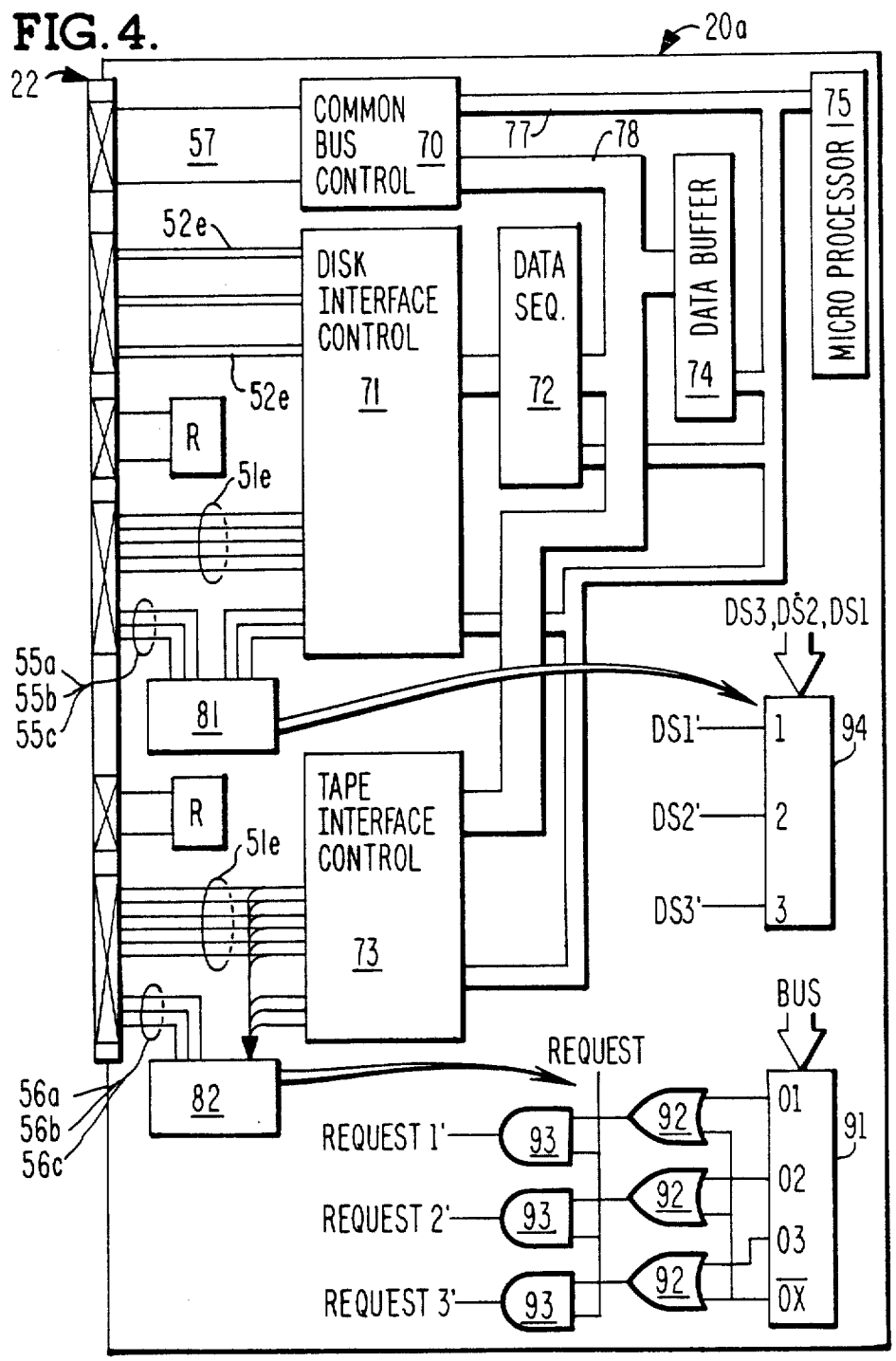
FIG. 4 shows the detailed layout of a control board for the disk and tape drives in the FIG. 1 assembly.

A detailed makeup of the control board 20a that plugs into the connector 22' at location 61a and generates the control signals for the disk and tape drives is illustrated in FIG. 4. It includes a bus control chip 70, a disk interface control chip 71, a data sequencer chip 72, a tape interface control chip 73, a data buffer chip 74, and a microprocessor chip 75. Suitably, chips 71, 72, 73, 74, and 75 respectively are an OMTI 5080, an OMTI 5060, an OMTI 5080, an OMTI 5070, and a Zilog Z8681-16.

In operation, a command to read or write data from either the disk drive or tape drive is received by the bus control chip 70. That command is received over a time shared bus 57 which interconnects all the logic boards 20 on the backplane. Microprocessor 75 interrogates the received command, and in response it selectively directs the chips 70 thru 73, via signals on bus 77, to perform the command.

A complete block of data that is to be written onto a disk or tape initially passes from bus 57 through bus controller 70 into data buffer 74. Then for a disk write, the data passes in real time on bus 78 through the data sequencer 72 and through the disk interface controller 71 onto the radial conductors 52e-52a. For a tape write, data passes on bus 78 through tape interface controller 73 onto the daisy-chained conductors 51e-51a.

Data that is read from the disk passes in real time over the radial conductors 52a-52e, through the disk controller 71, through the data sequencer 72, and to the data buffer 74. Data that is read from a tape passes in real time over the daisy-chained conductors 51a-51e through tape controller 73 and to data buffer 74. Then from buffer 74 the data passes on bus 78 through the bus controller 70 onto bus 57.

Also included in the FIG. 4 control board is a circuit 81 which generates the DS3', DS2', and DS1' signals on the conductors 55a-55c to the disks, and a circuit 82 which generates the REQUEST1', REQUEST2', and REQUEST3' signals on the conductors 56a-56c to the tapes. Circuit 82, as shown in detail, includes a PLA decoder 91, three OR gates 92, and three AND gates 93. In operation, decoder 91 receives signals on the QIC-02 eight-bit daisy-chained bus from chip 73 and detects the occurrence of a hexidecimal 01, 02, 04, $\overline{OX}$ (where "X" is a don't care).

Whenever a 01 or $\overline{OX}$ is decoded, the output signal from the upper OR gate goes true; whenever a 02 or $\overline{OX}$ is decoded, the output signal from the center OR gate goes true; and whenever a 03 or $\overline{OX}$ is decoded, the output signal from the lower OR gate goes true. Signals from the OR gates 92 are then ANDed with the QIC-02 REQUEST signal by the gates 93 to form REQUEST1', REQUEST2', and REQUEST3'.

Circuit 81 consists only of a PLA decoder chip 94 which receives the DS3, DS2, and DS1 signals from chip 71. This decoder generates DS3' true only when DS3, DS2, DS1 is an octal 3; generates DS2' true only when DS3, DS2, DS1 is an octal 2; and generates DS1' true only when DS3, DS2, DS1 is an octal 1.

A primary feature of the above described electromechanical memory assembly is that it is easy to initially install the drives and easy to expand their number. To initially install the drives, the address switches 45 are set to assign address #1 to all the drives, and the terminating resistors in the sockets 46 are removed from the drives. Then the boards 30 on which the disk drives are mounted are simply plugged into any of the backplane connectors 32' at locations 62a-62c; and the boards 30 on which the tape drives are mounted are simply plugged into any of the backplane connectors 32' at locations 63a-63c.

At any other time thereafter, another disk drive or tape drive can be added to the assembly by simply setting that drive's address switches to assign it address #1, removing its terminating resistors, and plugging the board 30 on which the drive is mounted into an empty connector. Setting of the address switches and removal of the terminating resistor can be done at the factory so that in the field, the board 30 need only be plugged into an empty connector. No cables, terminating resistors, or switches have to be moved from previously installed drives; so the expansion occurs quickly and is immune to human error. Also, no additional logic board 20 is required; so such an expansion is very inexpensive.

Another feature of the disclosed memory assembly is that it allows certain types of hardware failures to be quickly remedied. For example, if a connector 32' in one of the drive locations becomes defective, the problem is fixed by simply moving the corresponding drive board 30 to a different connector location. No cables, address switches, or terminating resistors have to be changed. A broken radial conductor 52d is remedied in the same fashion.

A preferred embodiment of an electromechanical memory assembly that is constructed according to the invention has now been described in detail. In addition, however, many changes and modifications can be made to these details without departing from the nature and spirit of the invention.

For example, all the disk drives need not be identical, and all the tape drives need not be identical. They can have different storage capacities, different physical dimensions, or operate at different speeds. Suitable alternative disk drives are the EXT-4175, EXT-4280, and EXT-4380 from Maxtor Corporation; and suitable alternative tape drives are Models 5920C and 5945C from Archive Corporation.

Accordingly, it is to be understood that the invention is not limited to the above details but is defined by the appended claims.

What is claimed is:

1. An electromechanical memory assembly for a data processing system including:
   a frame having a backplane, a plurality of printed circuit board connectors on said backplane, and conductors which interconnect said connectors on said backplane;
   a controller, on a printed circuit board which is plugged into one of said connectors and consists essentially of logic circuitry for generating and receiving control signals on said backplane conductors; and
   multiple data storage units; each unit being mounted on a separate printed circuit board, plugged into a separate one of said connectors, and consisting essentially of a mechanical drive mechanism which reads data by physically moving a data storage medium past a data sensor in direct response to said control signals on said backplane conductors; wherein each drive has switches for assigning the bits of a binary address to the drive, and has address terminals for receiving respective bits of binary address signals which select the drive when they equal the binary address assigned by said switches;

said controller includes a circuit for generating different binary address signals and for transforming them into separate single bit signals;

said conductors on said backplane being patterned to route a respective one of said single bit signals to a predetermined input terminal on each of said drives which is the same for all of the drives; and said switches on said drives being set to assign the same binary address to each drive, with said same binary address having a binary "one" in the bit position corresponding to said predetermined input terminal.

2. An assembly according to claim 1 wherein one of said data storage units is a disk drive.

3. An assembly according to claim 2 wherein one of said data storage units is a tape drive.

4. An assembly according to claim 1 wherein a group of said backplane conductors which carry said control signals are daisy-chained from said controller to said data storage units and then return to said controller and are there terminated in respective resistors.

5. An assembly according to claim 1 wherein at least two of said data storage units have different storage capacities.

6. An assembly according to claim 1 wherein at least two of said data storage units operate at different speeds.

7. An assembly according to claim 1 wherein at least two of said data storage units have different physical dimensions.

* * * * *